(12) United States Patent
Kuechler

(10) Patent No.: US 6,320,114 B1
(45) Date of Patent: Nov. 20, 2001

(54) SOLAR GENERATOR WITH ELECTRICALLY CONDUCTING HINGES

(75) Inventor: Gunter Kuechler, Haselau (DE)

(73) Assignee: DaimlerChrysler AG, Stuttgart (DE)

( * ) Notice: Subject to any disclaimer, the term of this patent is extended or adjusted under 35 U.S.C. 154(b) by 0 days.

(21) Appl. No.: 09/661,239

(22) Filed: Sep. 13, 2000

(30) Foreign Application Priority Data

Sep. 16, 1999 (DE) .................................. 199 44 414

(51) Int. Cl.⁷ .......................... H01L 31/045; H01L 31/05
(52) U.S. Cl. .......................... 136/245; 136/244; 136/251; 136/256
(58) Field of Search ................... 136/244, 245, 136/251, 256

(56) References Cited

U.S. PATENT DOCUMENTS

| | | | |
|---|---|---|---|
| 4,193,820 | * | 3/1980 | Thomas ................................. 136/244 |
| 4,713,492 | | 12/1987 | Hanak . |
| 4,755,231 | | 7/1988 | Kurland et al. . |
| 5,855,692 | | 1/1999 | Kaji et al. . |

FOREIGN PATENT DOCUMENTS

| | | | |
|---|---|---|---|
| 3210-312 | | 9/1983 | (DE) . |
| 3240327-A1 | * | 5/1984 | (DE) . |
| 8802500 | | 6/1988 | (DE) . |
| 0219734 | | 4/1987 | (EP) . |
| 2525393 | * | 10/1983 | (FR) . |

* cited by examiner

*Primary Examiner*—Alan Diamond
(74) *Attorney, Agent, or Firm*—W. F. Fasse; W. G. Fasse

(57) ABSTRACT

The electrically conducting backsides of solar blankets forming arrays are electrically interconnected by electrically conducting hinges. Tubular hinge elements are connected in an electrically conducting manner to edges of the blankets and an electrically conducting hinge pin extends through the tubular hinge elements.

5 Claims, 2 Drawing Sheets

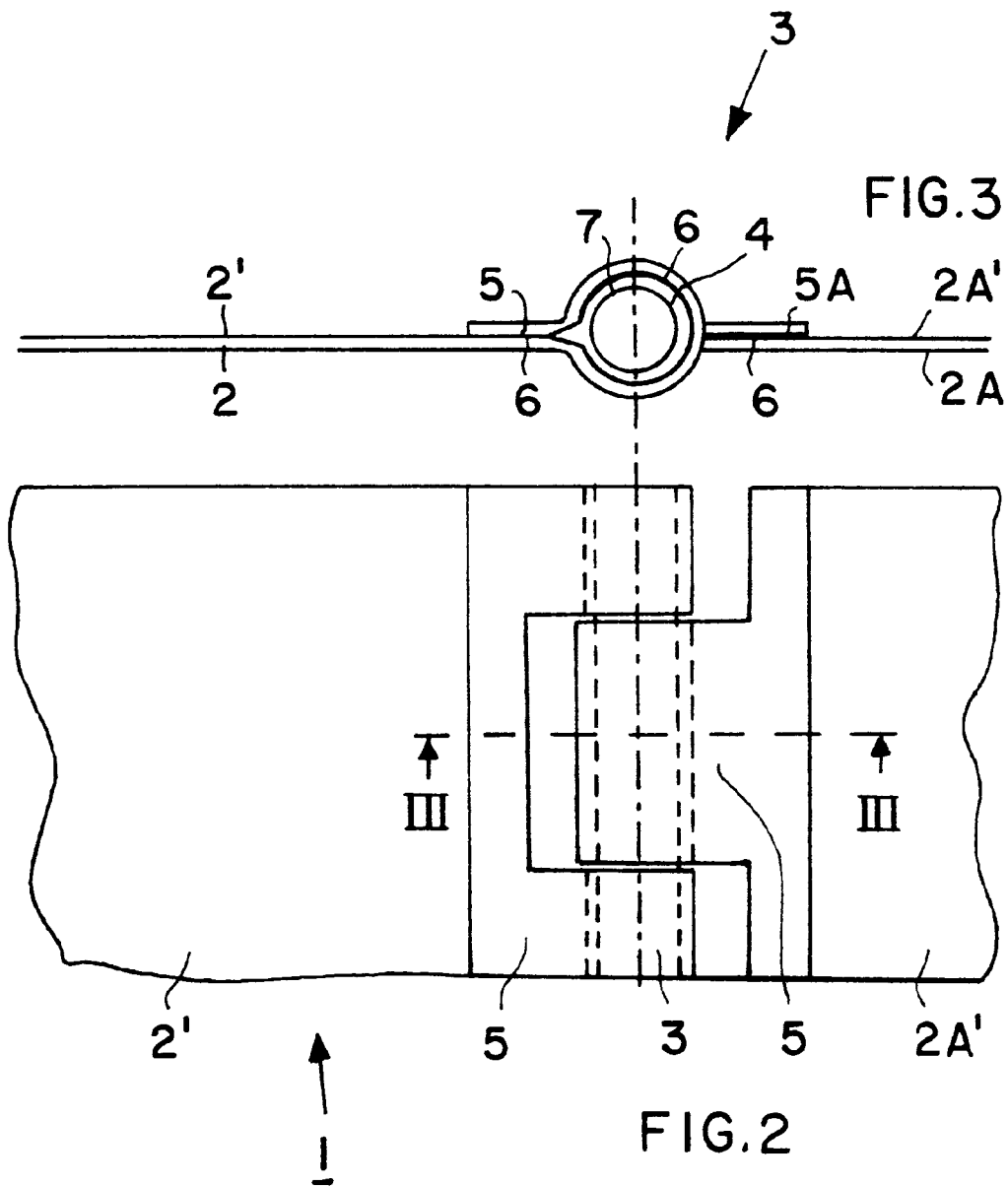

SOLAR GENERATOR WITH ELECTRICALLY CONDUCTING HINGES

PRIORITY CLAIM

This application is based on and claims the priority under 35 U.S.C. §119 of German Patent Application 199 44 414.5, filed on Sep. 16, 1999, the entire disclosure of which is incorporated herein by reference.

FIELD OF THE INVENTION

The invention relates to solar panels interconnected by hinges to form a flexible solar generator

BACKGROUND INFORMATION

The backsides of flexible solar generators must be electrically conductive for certain uses to dissipate electrostatic charges. Support films, so-called blankets or panels carrying solar cells, are coated on their backside with conductive material or with electrically conductive support films, such as black kapton (Trademark), are used as carrier panels or blankets. In an array of a flexible solar generator comprising several panels or blankets interconnected by hinges, the electrically-conductive surfaces of the blanket or panel must be electrically interconnected for dissipating static charges. Conventionally flexible conductors are bridging the hinge joints. These flexible conductors or bridging elements can cause the solar generators to fail due to thermal and mechanical stress. Further, such bridging elements add to the costs of the panels due to quality requirements which the installation of the bridging elements must satisfy.

European Patent Publication EP 0,219,734 A2 discloses large area solar power collector panels connected into arrays by hinges which are made of synthetic polymeric material including the hinge pin. For example, the hinge pin is a thin rod of polypropylene having a diameter of about 2 mm to keep the entire hinge flexible for rolling up the panels.

German Patent DE 32 10 312 C3 discloses a flexible, rollable solar generator with hinge connected panels. The hinges are formed by folded over sleeves. Aluminum bushings are glued into the sleeves. A thin flexible hinge pin (7) is inserted into the sleeves to mechanically connect the panels. No electrical connection is formed by this mechanical connection by the flexible hinge pin.

OBJECTS OF THE INVENTION

In view of the above it is the aim of the invention to achieve the following objects singly or in combination:
- to provide a reliable and economical electrical interconnection between the conductive backside surfaces of the panels forming a flexible solar generator; and
- to construct a flexible panel connection to have mechanical and electrical connector qualities with low electrical transition resistances.

SUMMARY OF THE INVENTION

A flexible solar generator comprising a plurality of panels having electrically conducting panel backsides, is characterized according to the invention by an electrically conducting hinge joining neighboring panels of said plurality of panels to each other to form at least one solar generator array, said electrically conducting hinge comprising electrically conducting tubular hinge elements, an electrically conducting hinge pin extending through said tubular hinge elements for joining said electrically conducting tubular hinge elements to form said electrically conducting hinge and means electrically and mechanically connecting said electrically conducting tubular hinge elements to edges of said panel backsides so that all electrically conducting panel backsides of said array are electrically interconnected with one another.

The hinged electrical and mechanical interconnection according to the invention can function without damage over the entire life of a flexible solar generator exposed to 36000 thermal cycles of +100° C. to −100° C. in low earth orbit or 2000 thermal cycles of +100° C. to −180° C. in geostationary orbit. The present panels can be folded and unfolded or rolled and unrolled repeatedly for any purpose such as testing, system integration, stowing on earth and unfolding or unrolling in orbit. Furthermore, the hinged interconnection according to the invention is economical since no additional bridge elements nor associated installation steps are required. According to the invention, the hinge connections between the panels or so-called blankets are additionally used as electrical connections for electrically interconnecting the electrically conductive back surfaces of the blankets for static charge dissipation from all panels to common ground through low transition resistances in the hinges.

BRIEF DESCRIPTION OF THE DRAWINGS

An exemplary embodiment of the invention will be described in the following with reference to the accompanying drawings, wherein:

FIG. 2 shows the electrical and mechanical interconnection according to the invention of the conductive back surfaces of the panels forming an array, whereby the electrically conducting backside surfaces of the panels face the viewer; and FIG. 3 is a sectional view along section line III—III in FIG. 2.

Figure 1:
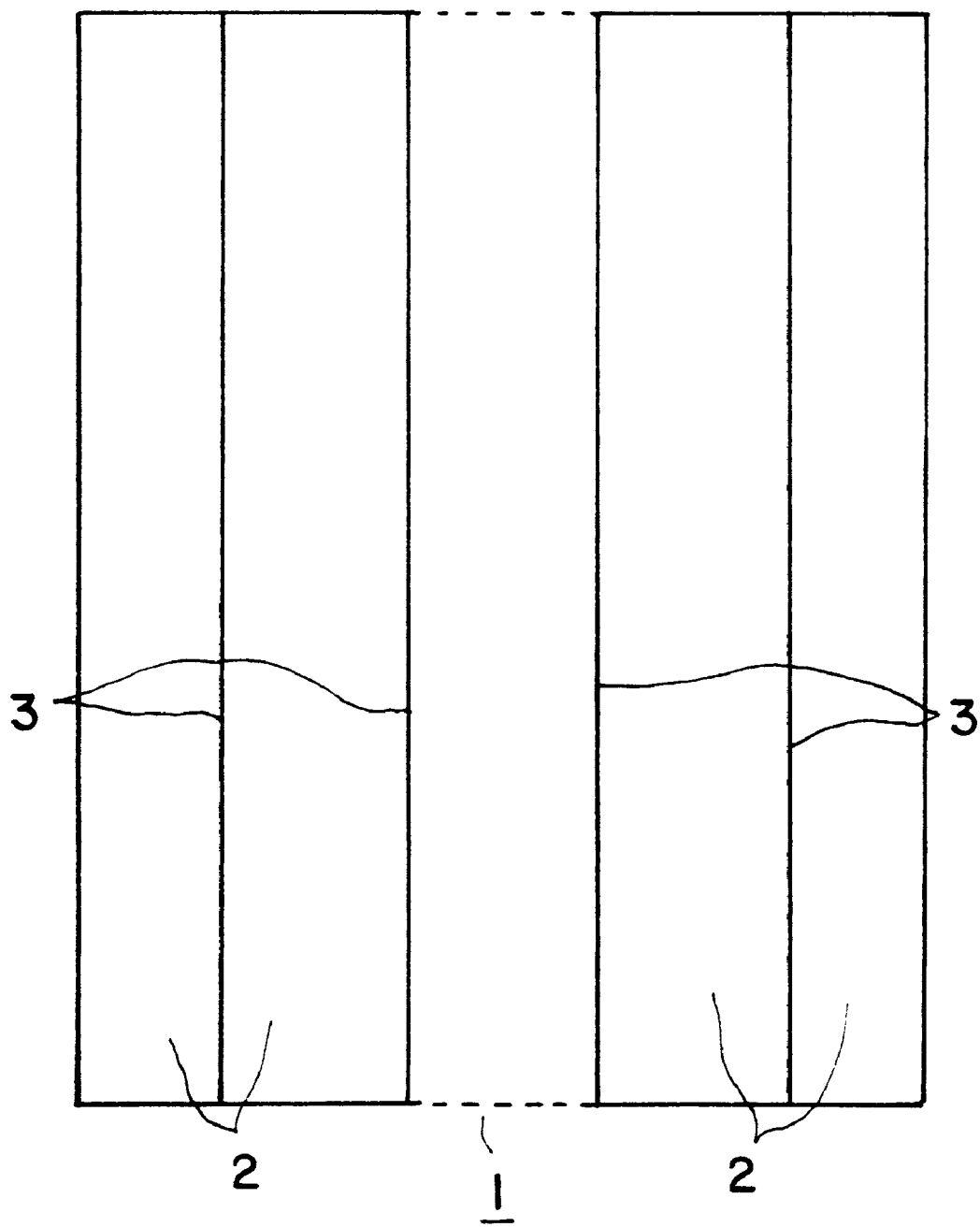
FIG. 1 shows a plan view of an array of a flexible solar generator having several hinged panels.

DETAILED DESCRIPTION OF PREFERRED EXAMPLE EMBODIMENTS AND OF THE BEST MODE OF THE INVENTION

The array 1 in FIG. 1 of a flexible solar generator comprises several blankets or panels 2 that are connected in a foldable manner by electrically conducting piano hinges 3. In FIG. 1, the dotted line indicates that an array 1 normally comprises more than four blankets or panels 2 that are schematically shown in FIG. 1.

FIGS. 2 and 3 show a plan view of a hinge portion and a section of the electrical hinged interconnection of the conductive back-sides of neighboring panels 2 and 2A in the array 1. Each panel 2, 2A has an electrically conducting backside surface 2', 2A'. The electrical interconnection according to the invention is provided directly by the hinges 3 that are made of electrically conductive material. Electrically conducting tubular hinge elements 4 of the hinges 3 are fixed by an electrically conductive adhesive 6 to neighboring edges of the electrically conductive backsides 2', 2A' of the panels 2, whereby an electrical connection is formed between the conductive backsides of the respective panel to which the particular tubular hinge element 4 is electrically connected, and the entire surface of all the tubular hinge elements 4 to keep transition resistances low.

Referring to FIG. 3, the piano hinge 3 is preferably formed by mechanically connecting the tubular hinge elements 4 with a continuous hinge pin 7 that is also made of an electrically conductive material, whereby a reliable electrical interconnection of the electrically conductive backsides 2', 2A' of the panels or blankets 2, 2A is achieved through the hinge pin fully in electrical contact with the tubular hinge elements 4 which in turn are fully in electrical contact with the electrically conducting back surfaces 2', 2A' of the panels.

In the exemplary embodiment in FIG. 2, the tubular hinge elements 4 are preferably formed by folding the blanket or panel edges over with the electrically conductive adhesive 6 around the tubular hinge elements 4 so that these elements are held in the formed pockets. Margins 5, 5A of the panel edges are provided along the pockets for the tubular hinge elements 4 so that, after folding, the respective electrically conducting surfaces 2', 2A' face each other to form gaps with electrically conducting adhesive 6 in the gaps whereby the electrical contact between the hinges and the electrically conducting back surfaces 2' and 2A' is established over substantial surface areas thereby keeping any electrical transition resistances low for an efficient discharge of static charges from all panels.

There are alternative ways of fixing the tubular hinge elements 4 to the blanket edges or margins 5, 5A such as riveting, clamping or a sewn connection.

Although the invention has been described with reference to specific example embodiments, it will be appreciated that it is intended to cover all modifications and equivalents within the scope of the appended claims. It should also be understood that the present disclosure includes all possible combinations of any individual features recited in any of the appended claims.

What is claimed is:

1. A flexible solar generator comprising a plurality of panels having electrically conducting panel backsides, an electrically conducting piano hinge joining neighboring panels of said plurality of panels to each other to form at least one solar generator array, said electrically conducting hinge extending along a full length of said neighboring panels, said electrically conducting piano hinge comprising electrically conducting tubular hinge elements, an electrically conducting hinge pin extending through said tubular electrically conducting hinge elements for joining said electrically conducting tubular hinge elements to form said piano hinge, and means electrically and mechanically connecting said electrically conducting tubular hinge elements to edges of said electrically conducting panel backsides so that all electrically conducting panel backsides of said array are electrically interconnected with one another through said electrically conducting tubular hinge elements and through said electrically conducting hinge pin for providing low electrical transition resistances in said piano hinge.

2. The flexible solar generator of claim 1, wherein said connecting means comprise an electrically conducting adhesive that secures said tubular hinge elements to said edges of said electrically conducting panel backsides.

3. The flexible solar generator of claim 1, wherein said connecting means comprise pockets formed by folding over said edges of said electrically conducting panel backsides so that edges of said electrically conducting panel backsides face said pockets, and wherein said electrically conducting tubular hinge elements are fixed in said pockets.

4. The flexible solar generator of claim 3, further comprising overlapping margins extending along said pockets and wherein said connecting means further comprise any one of rivets, adhesive bonding, stitching, and clamps holding said overlapping margins together for forming said pockets.

5. The flexible solar generator of claim 1, wherein said electrically conducting panel backsides fully envelope an outer surface of said electrically conducting tubular hinge elements to form a full surface area electrical contact between said electrically conducting tubular hinge elements and said electrically conducting panel backsides, and wherein an outer surface of said electrically conducting hinge pin fully engages an inner surface of said tubular hinge elements to form a full surface area electrical contact between said electrically conducting hinge pin and said electrically conducting tubular hinge elements.

* * * * *